(12) United States Patent
Sung et al.

(10) Patent No.: US 11,814,723 B2
(45) Date of Patent: Nov. 14, 2023

(54) STABILIZED METAL MONOLAYER STRUCTURE

(71) Applicant: IUCF-HYU (INDUSTRY-UNIVERSITY COOPERATION FOUNDATION HANYANG UNIVERSITY), Seoul (KR)

(72) Inventors: Myung Mo Sung, Seoul (KR); Hong Bum Kim, Seoul (KR); Jin Won Jung, Suwon-si (KR); Kyu Seok Han, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 1170 days.

(21) Appl. No.: 16/166,500

(22) Filed: Oct. 22, 2018

(65) Prior Publication Data

US 2019/0055644 A1  Feb. 21, 2019

Related U.S. Application Data

(63) Continuation of application No. PCT/KR2017/004259, filed on Apr. 21, 2017.

(30) Foreign Application Priority Data

Apr. 21, 2016  (KR) .................. 10-2016-0048681
Apr. 21, 2017  (KR) .................. 10-2017-0051353

(51) Int. Cl.
*C23C 16/02* (2006.01)
*C23C 16/06* (2006.01)
(Continued)

(52) U.S. Cl.
CPC ............ *C23C 16/0272* (2013.01); *B05D 1/60* (2013.01); *B05D 7/52* (2013.01); *B32B 7/02* (2013.01);
(Continued)

(58) Field of Classification Search
CPC ..... C23C 30/00; C23C 16/0272; C23C 16/06; C23C 16/08; C23C 16/45525;
(Continued)

(56) References Cited

U.S. PATENT DOCUMENTS

2007/0098996 A1* 5/2007 Frey .................... C23C 18/1806
257/E21.174

FOREIGN PATENT DOCUMENTS

KR  10-1790927 B1  10/2017

OTHER PUBLICATIONS

Pia Sundberg, et al., "Organic and inorganic-organic thin film structures by molecular layer deposition: A review", Beilstein Journal of Nanotechnology, 2014, pp. 1104-1136, vol. 5, July.
(Continued)

*Primary Examiner* — Michael E. La Villa
(74) *Attorney, Agent, or Firm* — Sughrue Mion, PLLC

(57) ABSTRACT

A stabilized elementary metal structure is disclosed. The stabilized elementary metal structure may include an elementary metal having at least one layer and having a two-dimensional layer structure, and an organic molecular layer provided on at least one of a top surface and a bottom surface of the elementary metal.

10 Claims, 13 Drawing Sheets
(9 of 13 Drawing Sheet(s) Filed in Color)

(51) Int. Cl.
- C23C 16/455 (2006.01)
- B32B 5/04 (2006.01)
- B82B 1/00 (2006.01)
- C23C 16/08 (2006.01)
- B32B 15/00 (2006.01)
- C23C 16/56 (2006.01)
- B05D 1/00 (2006.01)
- B05D 7/00 (2006.01)
- B32B 7/04 (2019.01)
- C23C 16/44 (2006.01)
- B32B 7/02 (2019.01)
- C23C 30/00 (2006.01)
- B32B 15/04 (2006.01)
- C23C 16/14 (2006.01)
- B32B 7/025 (2019.01)
- C23C 16/18 (2006.01)
- C23C 16/16 (2006.01)
- B82B 3/00 (2006.01)

(52) U.S. Cl.
CPC .......... *B32B 7/025* (2019.01); *B32B 7/04* (2013.01); *B32B 15/00* (2013.01); *B32B 15/04* (2013.01); *C23C 16/0281* (2013.01); *C23C 16/06* (2013.01); *C23C 16/08* (2013.01); *C23C 16/14* (2013.01); *C23C 16/16* (2013.01); *C23C 16/18* (2013.01); *C23C 16/44* (2013.01); *C23C 16/455* (2013.01); *C23C 16/45525* (2013.01); *C23C 16/45527* (2013.01); *C23C 16/45555* (2013.01); *C23C 16/45557* (2013.01); *C23C 16/56* (2013.01); *C23C 30/00* (2013.01); *B82B 1/001* (2013.01); *B82B 1/008* (2013.01); *B82B 3/0009* (2013.01); *B82B 3/0019* (2013.01); *B82B 3/0038* (2013.01); *B82B 3/0066* (2013.01); *B82B 3/0095* (2013.01); *Y10T 428/1284* (2015.01); *Y10T 428/12556* (2015.01); *Y10T 428/12806* (2015.01); *Y10T 428/12826* (2015.01); *Y10T 428/12833* (2015.01); *Y10T 428/2495* (2015.01); *Y10T 428/24967* (2015.01); *Y10T 428/24975* (2015.01); *Y10T 428/26* (2015.01); *Y10T 428/261* (2015.01); *Y10T 428/263* (2015.01); *Y10T 428/264* (2015.01); *Y10T 428/265* (2015.01); *Y10T 428/268* (2015.01)

(58) Field of Classification Search
CPC ..... C23C 16/56; C23C 16/0281; C23C 16/14; C23C 16/44; C23C 16/45527; C23C 16/45555; C23C 16/45557; C23C 16/455; C23C 16/16; C23C 16/18; B05D 1/60; B05D 7/52; B32B 15/00; B32B 15/04; B32B 7/02; B32B 7/025; B32B 7/04; Y10T 428/12556; Y10T 428/12806; Y10T 428/12826; Y10T 428/1284; Y10T 428/12833; Y10T 428/2495; Y10T 428/24967; Y10T 428/24975; Y10T 428/261; Y10T 428/26; Y10T 428/263; Y10T 428/264; Y10T 428/265; Y10T 428/268; B82B 1/001; B82B 1/008; B82B 3/0019; B82B 3/0038; B82B 3/0066; B82B 3/0095; B82B 3/0009
See application file for complete search history.

(56) References Cited

OTHER PUBLICATIONS

Xin Chen, et al., "Functionalization of Two-Dimensional Transition-Metal Dichalcogenides", Advanced Materials, 2016, pp. 5738-5746, vol. 28, No. 27, Feb. 2016.
Suyeon Cho, et al., "Applications of metal-semiconductor phase transition in 2D layered transition metal dichalcogenides", Vacuum Magazine, Mar. 3, 2016, pp. 4-8.
International Search Report for PCT/KR2017/004259 dated Aug. 1, 2017 [PCT/ISA/210].

* cited by examiner

[FIG. 1]
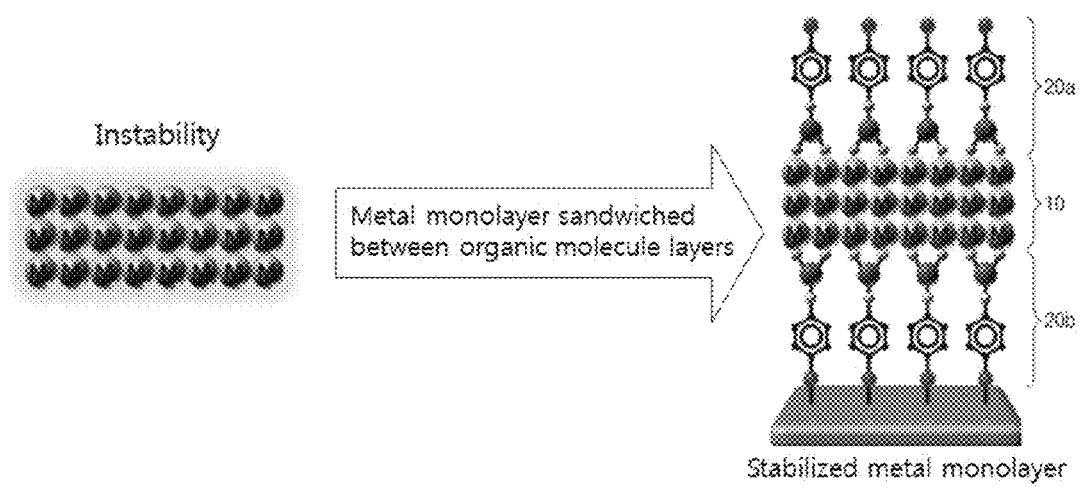

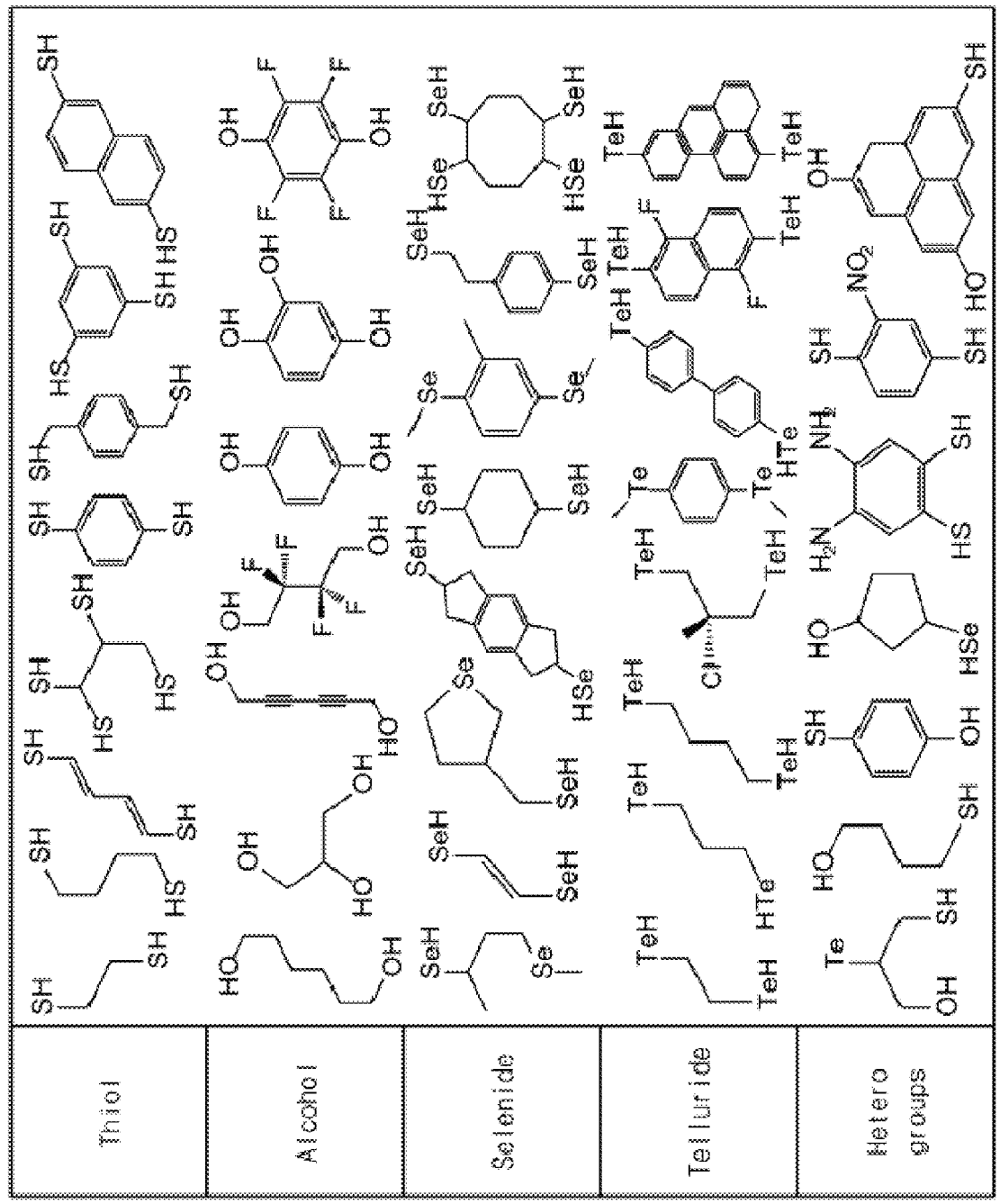
[FIG. 2]

[FIG. 3]
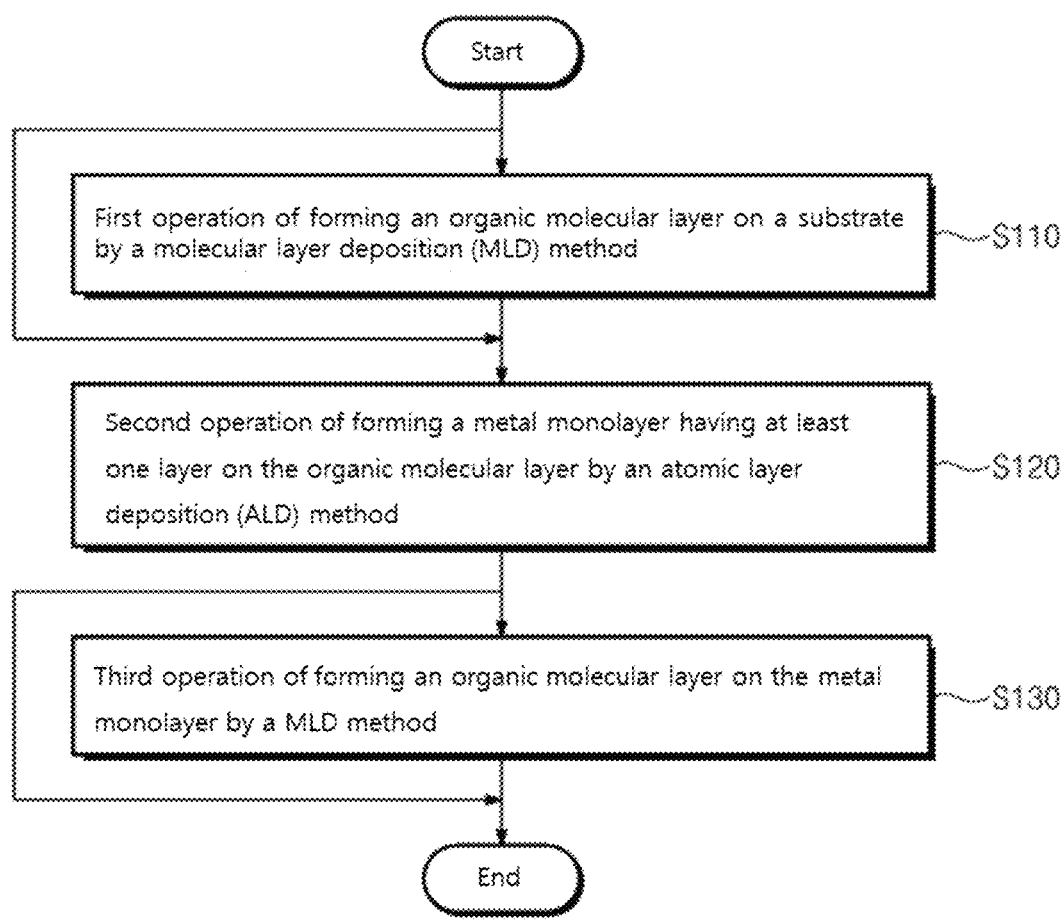

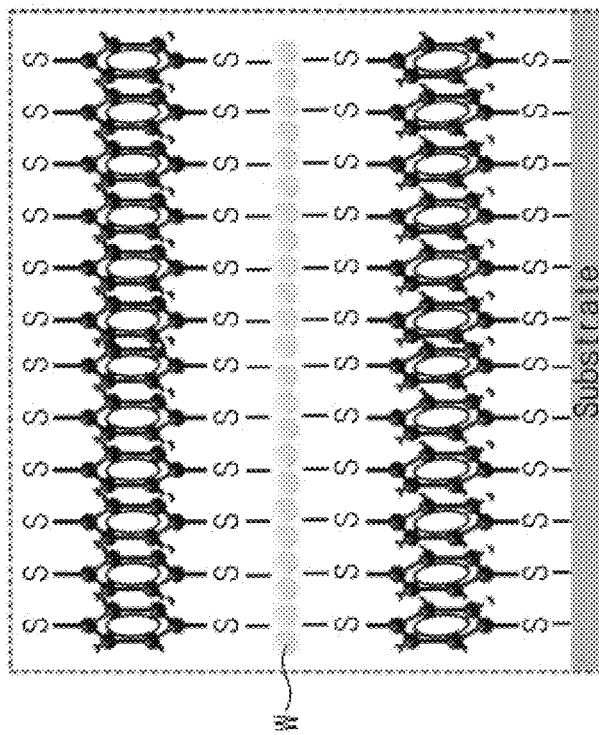
[FIG. 4A]
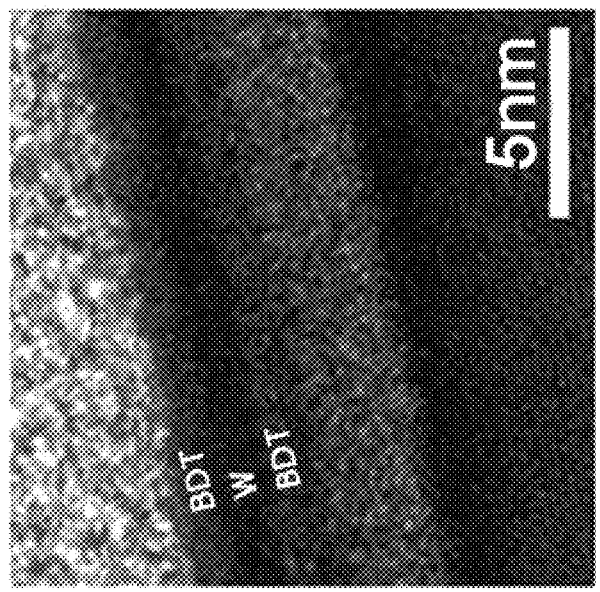
[FIG. 4B]

[FIG. 5]
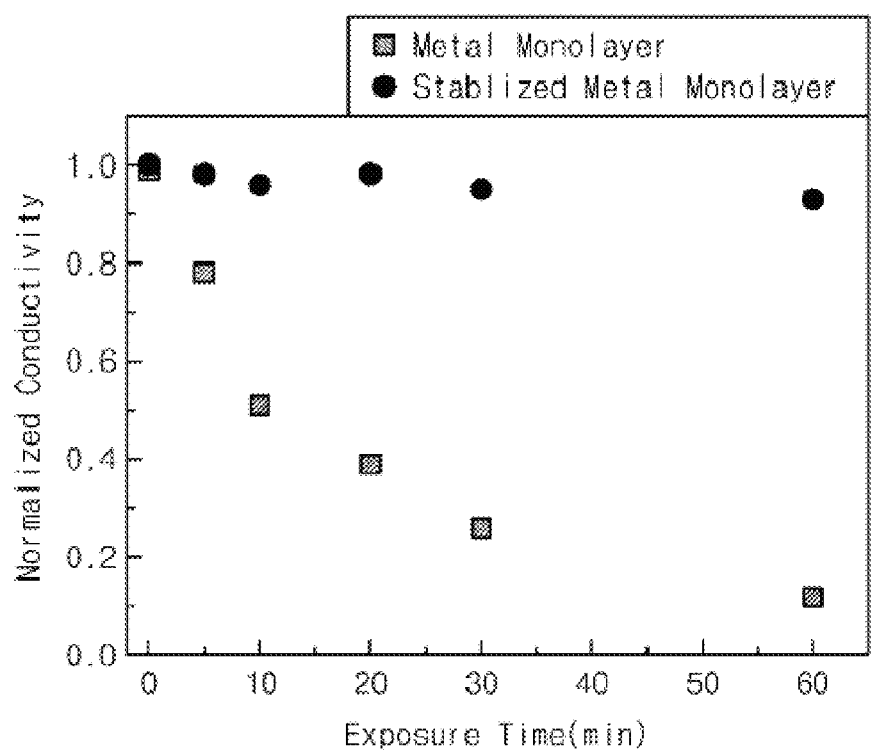

[FIG. 6]
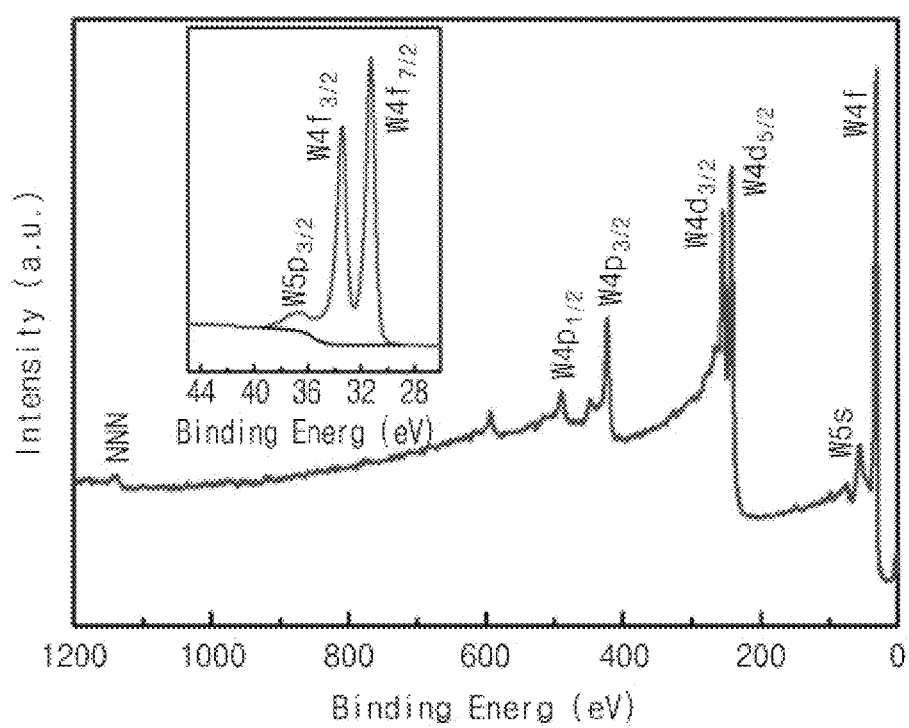

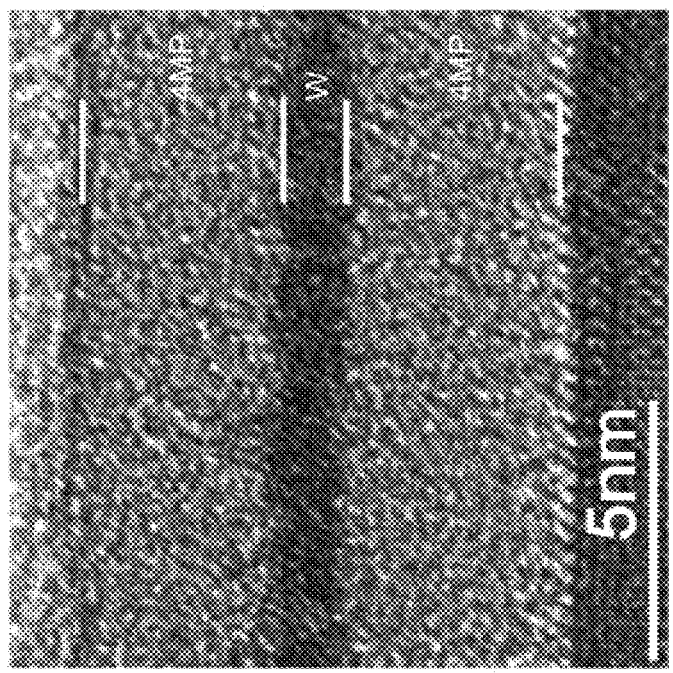
[FIG. 7A]
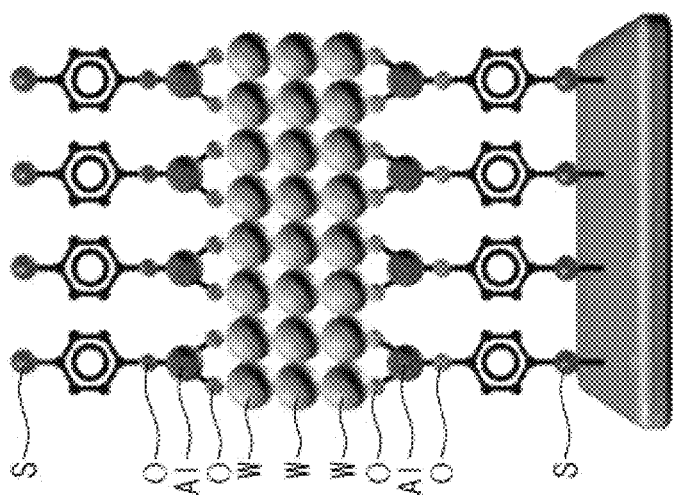
[FIG. 7B]

[FIG. 8]
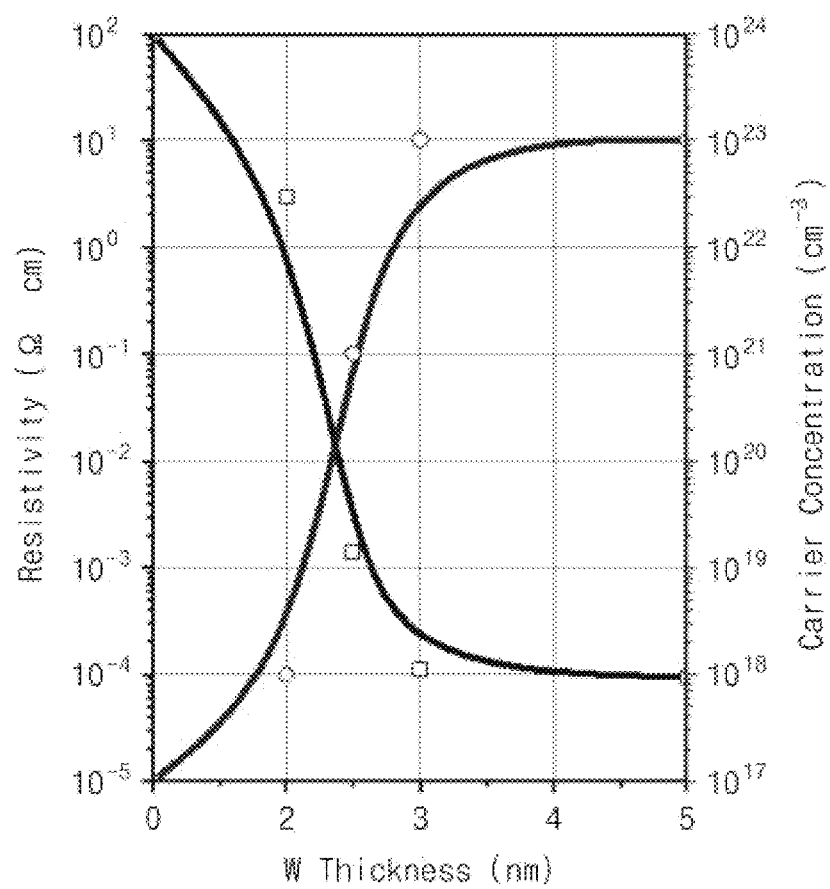

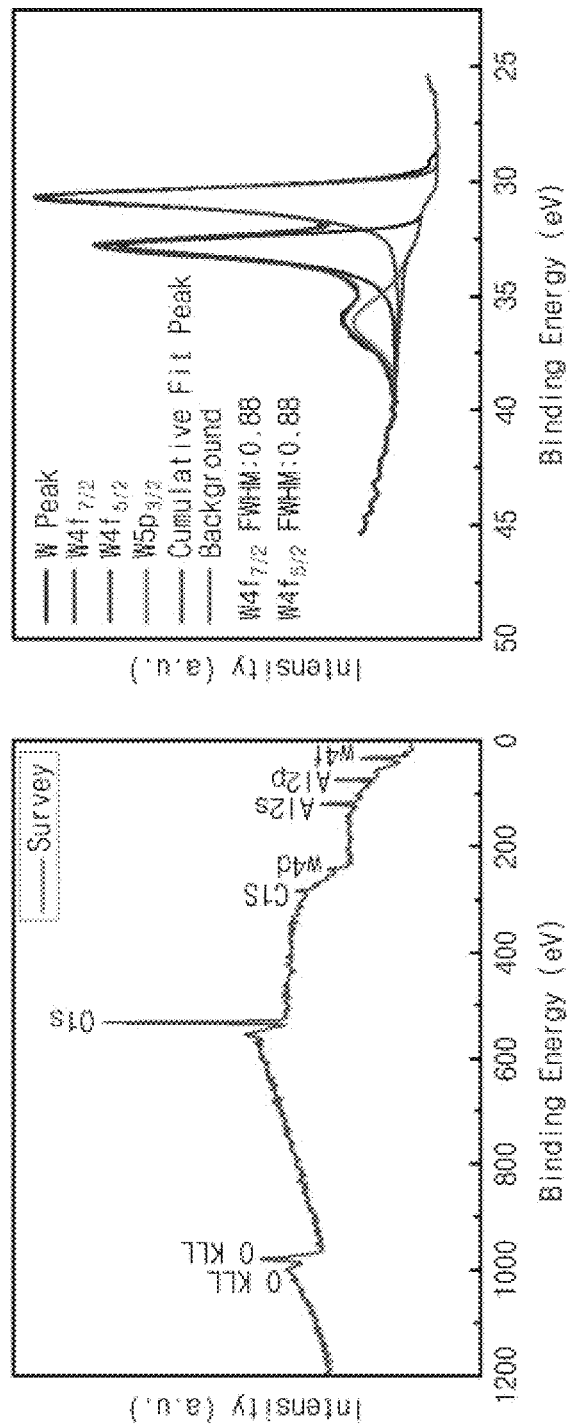
[FIG. 9B]
[FIG. 9A]

[FIG. 10]
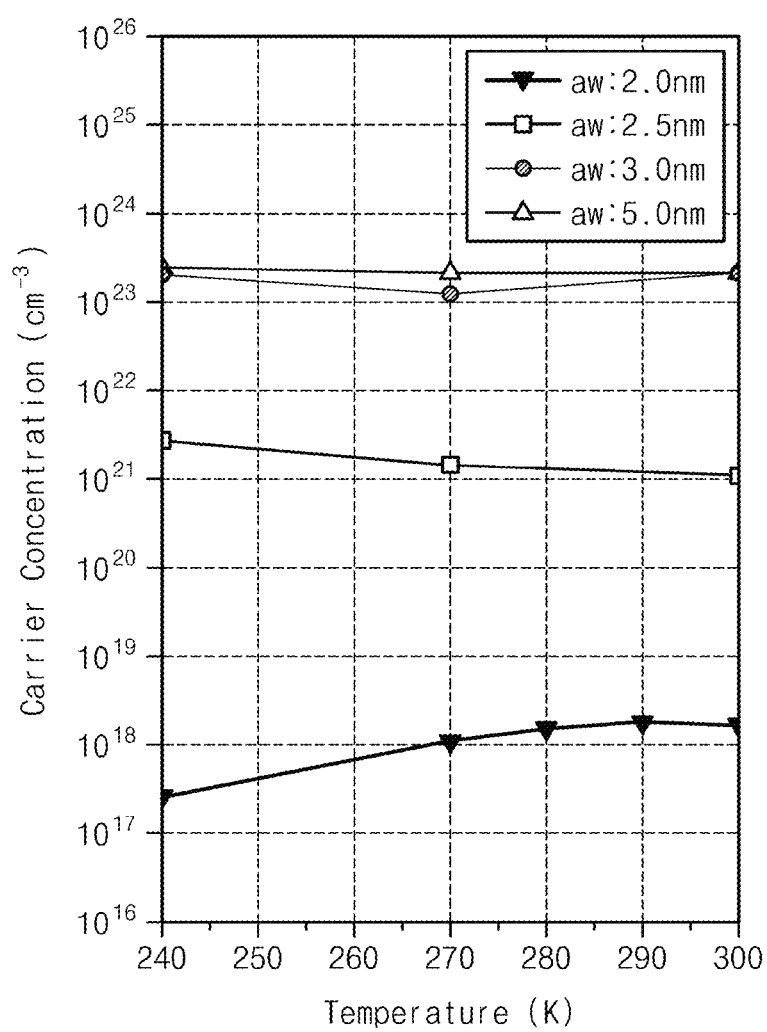

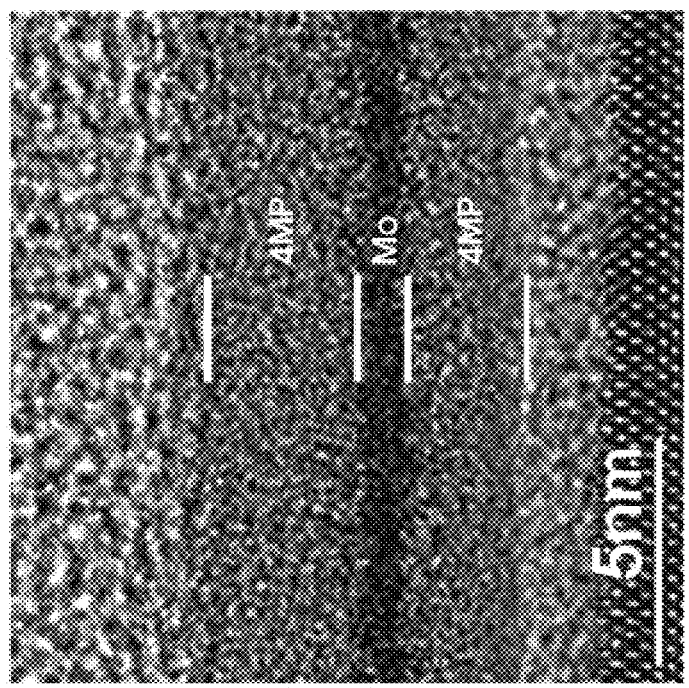
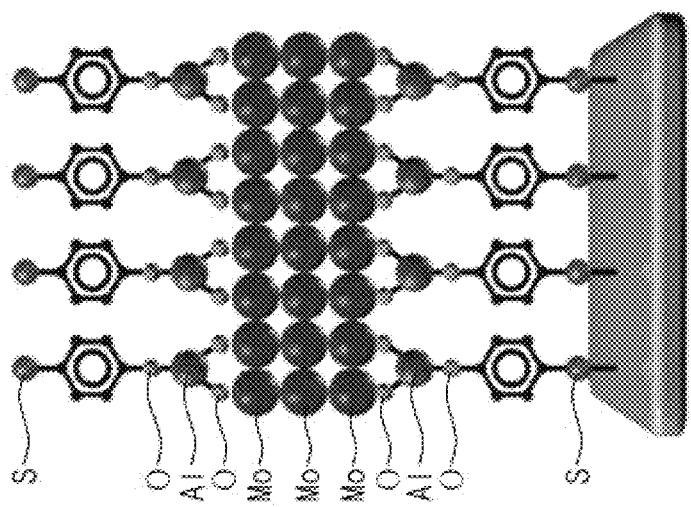
[FIG. 11A]
[FIG. 11B]

[FIG. 12]
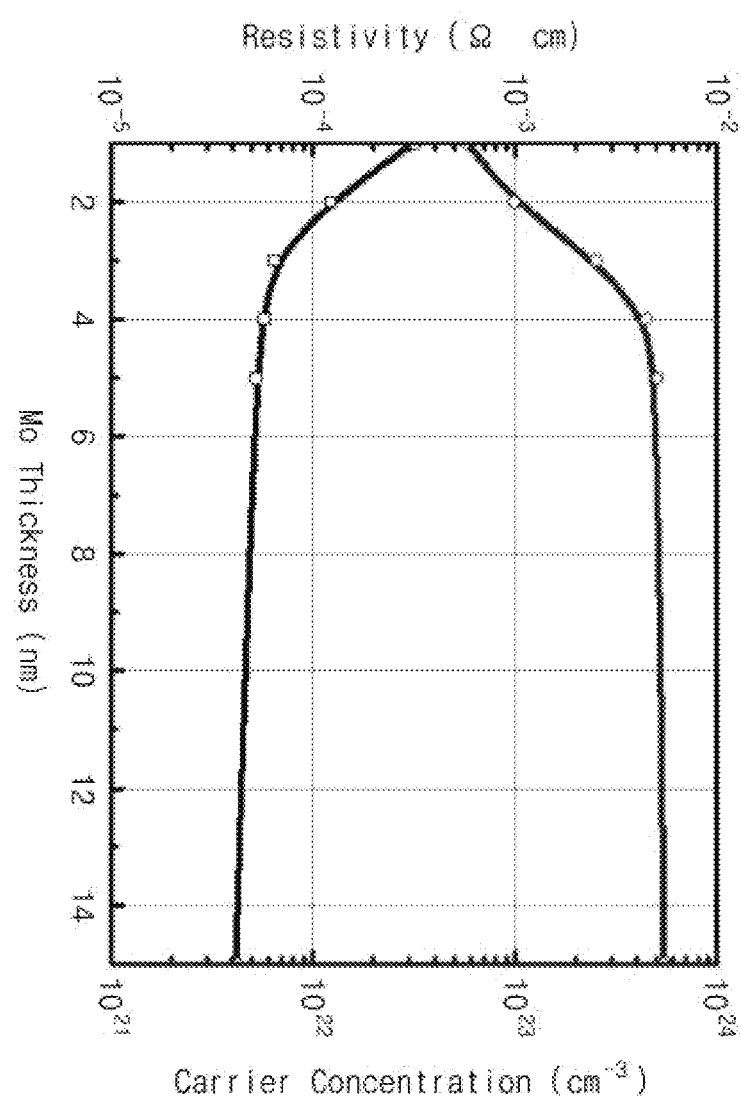

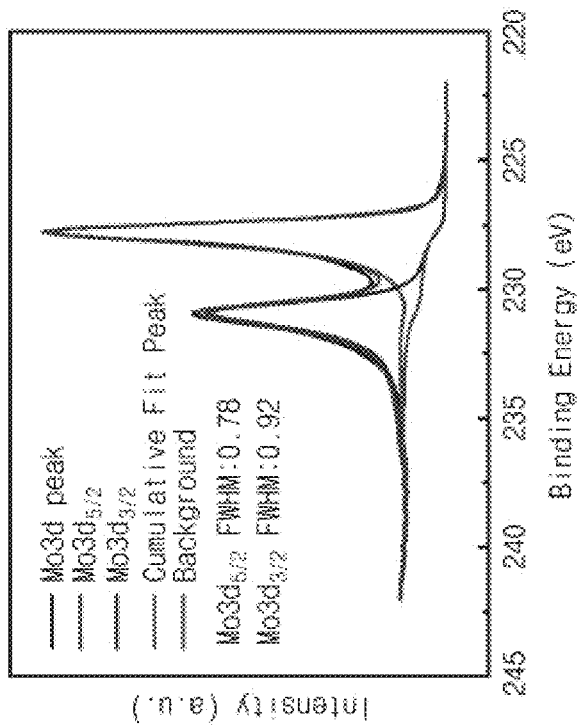
[FIG. 13B]
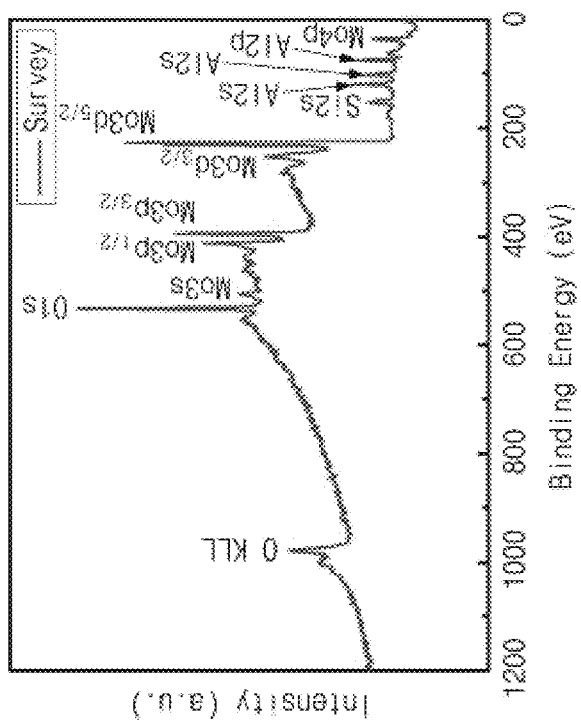
[FIG. 13A]

STABILIZED METAL MONOLAYER STRUCTURE

CROSS-REFERENCE TO RELATED APPLICATION

This application is a continuation of pending International Application No. PCT/KR2017/004259, which was filed on Apr. 21, 2017 and claims priority to Korean Patent Application Nos. 10-2016-0048681 and 10-2017-0051353, filed on Apr. 21, 2016 and Apr. 21, 2017, respectively, in the Korean Intellectual Property Office, the disclosures of which are hereby incorporated by reference in their entireties.

BACKGROUND

1. Field

The present disclosure herein relates to a stabilized elementary metal structure and a method of manufacturing the same. More particularly, the present disclosure relates to an elementary metal structure which maintains a structural shape of a two-dimensional layer structure of an elementary metal by providing an organic molecular layer on at least one of a top surface and a bottom surface of the elementary metal and has semiconductor properties, and a method of manufacturing the same.

2. Description of the Related Art

Recently, high-performance hardware or software has been required. Thus, high-speed, high-capacity and low-power electronic devices have been actively studied.

However, even though conventional MOSFETs have been highly integrated, the integration density of the conventional MOSFETs is still limited. This is because problems are caused by the high integration density. For example, high-temperature heat may be generated by an increase in density of elements on an integrated circuit, and thus reliability of the integrated circuit may be deteriorated by the high-temperature heat.

Accordingly, a down scaling method may have a fundamental limitation in realizing characteristics of electronic devices required in the future.

Thus, creative materials applicable to future-oriented devices are being studied.

SUMMARY

The present disclosure may provide a physically and chemically stabilized elementary metal structure and a method of manufacturing the same.

The present disclosure may also provide a stabilized elementary metal structure having semiconductor properties and a method of manufacturing the same.

The present disclosure may further provide a stabilized elementary metal structure having non-bulk metal properties by limiting the number of elementary metal(s) and a method of manufacturing the same.

The present disclosure may further provide a stabilized elementary metal structure and a method of manufacturing the same, which are capable of simplifying processes.

In an aspect, a stabilized elementary metal structure may include an elementary metal having at least one layer and having a two-dimensional layer structure, and an organic molecular layer provided on at least one of a top surface and a bottom surface of the elementary metal.

In an embodiment, a metallic property of the elementary metal by X-ray photoelectron spectroscopy (XPS) analysis may be maintained even though the elementary metal is combined with the organic molecular layer.

In an embodiment, the elementary metal may be composed of a predetermined number of one or more layers, and the elementary metal composed of the predetermined number of one or more layers may have semiconductor properties, unlike a bulk metal formed of a metal of the elementary metal.

In an embodiment, a carrier concentration in the elementary metal composed of the predetermined number of one or more layers may not decrease as temperature rises.

In an embodiment, the elementary metal composed of the predetermined number of one or more layers may have a band gap.

In an embodiment, a resistivity of the elementary metal may decrease as the predetermined number of one or more layers increases.

In an embodiment, the elementary metal may lose the semiconductor properties when the number of layers of the elementary metal is greater than the predetermined number.

In an embodiment, the elementary metal may be formed of a metal selected from Group 4 metals, Group 5 metals and Group 6 metals, and the organic molecular layer may include a chalcogen element.

In an embodiment, the organic molecular layer may maintain a structural shape of the two-dimensional layer structure.

In an embodiment, the elementary metal may be composed of at least three layers, and at least one of a lowermost layer and an uppermost layer of the elementary metal may be combined with the organic molecular layer.

In an aspect, a stabilized elementary metal structure may include an elementary metal having at least one layer and having a two-dimensional layer structure. The elementary metal may provide a band gap.

In an embodiment, the elementary metal may have a predetermined number of one or more layers, and the elementary metal composed of the predetermined number of one or more layers may have semiconductor properties, unlike a bulk metal formed of a metal of the elementary metal.

In an aspect, a method of manufacturing a stabilized elementary metal structure may include first operation of forming an organic molecular layer on a substrate by a molecular layer deposition (MLD) method, second operation of forming an elementary metal having at least one layer on the organic molecular layer by an atomic layer deposition (ALD) method, and third operation of forming an organic molecular layer on the elementary metal by a molecular layer deposition (MLD) method. At least one of the first operation and the third operation may be performed.

In an embodiment, a metallic property of the elementary metal by X-ray photoelectron spectroscopy (XPS) analysis may be maintained when the organic molecular layer and the elementary metal formed in the first and second operations or the third and second operations are combined with each other.

In an embodiment, the second operation may be repeatedly performed a predetermined number of times such that the elementary metal has semiconductor properties unlike a bulk metal formed of a metal of the elementary metal.

In an embodiment, the organic molecular layer may maintain a structural shape of a two-dimensional layer structure of the elementary metal.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1 is a schematic view illustrating a typical elementary metal and a stabilized elementary metal structure according to an embodiment of the inventive concepts.

FIG. 2 is a view illustrating an organic molecule according to an embodiment of the inventive concepts.

FIG. 3 is a flowchart illustrating a method of manufacturing a stabilized elementary metal structure according to an embodiment of the inventive concepts.

FIG. 4A and FIG. 4B show a molecule structure and a TEM image of a stabilized elementary metal structure according to a first experimental example of the inventive concepts.

FIG. 5 is a graph showing changes in conductivity over time of a typical elementary metal and the stabilized elementary metal structure according to the first experimental example of the inventive concepts.

FIG. 6 is a graph showing XPS analysis of the stabilized elementary metal structure according to the first experimental example of the inventive concepts.

FIG. 7A and FIG. 7B show a molecule structure and a TEM image of a stabilized elementary metal structure according to a second experimental example of the inventive concepts.

FIG. 8 is a graph showing electrical characteristics according to a thickness of the stabilized elementary metal structure according to the second experimental example of the inventive concepts.

FIG. 9A and FIG. 9B show XPS analysis of the stabilized elementary metal structure according to the second experimental example of the inventive concepts.

FIG. 10 is a graph showing a change in carrier concentration according to temperature of the stabilized elementary metal structure according to the second experimental example of the inventive concepts.

FIG. 11A and FIG. 11B show a molecule structure and a TEM image of a stabilized elementary metal structure according to a third experimental example of the inventive concepts.

FIG. 12 is a graph showing electrical characteristics according to a thickness of the stabilized elementary metal structure according to the third experimental example of the inventive concepts.

FIG. 13A and FIG. 13B show XPS analysis of the stabilized elementary metal structure according to the third experimental example of the inventive concepts.

DETAILED DESCRIPTION OF THE EMBODIMENTS

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

FIG. 1 is a schematic view illustrating a typical elementary metal and a stabilized elementary metal structure according to an embodiment of the inventive concepts. FIG. 2 is a view illustrating an organic molecule according to an embodiment of the inventive concepts. Hereinafter, a stabilized elementary metal structure may be abbreviated as an elementary metal structure for the purpose of ease and convenience in description.

Referring to a typical elementary metal illustrated in a left side of FIG. 1, the typical elementary metal may be aggregated by high reactivity of a metal. In other words, instability exists in the typical elementary metal. In addition, the typical elementary metal may be easily oxidized in the atmosphere due to the high reactivity of the metal.

Referring to an elementary metal structure (right side) according to an embodiment of the inventive concepts illustrated in a right side of FIG. 1, the elementary metal structure may include an elementary metal 10 having at least one layer, and an organic molecular layer 20a and 20b formed on at least one of a top surface and a bottom surface of the elementary metal 10. In other words, the elementary metal 10 may be sandwiched between the organic molecular layers 20a and 20b. In another aspect, the elementary metal 10 may be composed of at least three layers, and at least one of a lowermost layer and an uppermost layer of the elementary metal 10 may be combined with the organic molecular layer. Here, the organic molecular layer may inhibit reactivity of the elementary metal and thus may stably maintain a layer shape of the elementary metal.

According to an embodiment, a metal of the elementary metal may be a metal capable of forming a two-dimensional (2D) layer structure, for example, a metal selected from Group 4 metals, Group 5 metals and Group 6 metals. In more detail, the metal of the elementary metal may be formed of at least one of Ti, V, Cr, Mn, Fe, Co, Ni, Cu, Zn, Zr, Nb, Mo, Tc, Ru, Rh, Pd, Ag, Cd, Hf, Ta, W, Re, Os, Ir, Pt, Au, or Hg.

The elementary metal may be composed of at least one layer. For example, unlike a bulk metal, the elementary metal may have an upper limit number of layers, which is capable of having semiconductor properties. For example, the elementary metal formed of tungsten may be composed of 15 layers or less, in particular, of 6 layers or less. In this case, the elementary metal formed of tungsten may have a thickness of 5 nm or less, in particular, 2 nm or less. For another example, the elementary metal formed of molybdenum may be composed of 15 layers or less and may have a thickness of 5 nm or less. Here, for example, the elementary metal may be composed of at least three layers.

In an embodiment, the organic molecular layer may include a chalcogen element. In addition, the organic molecular layer may be formed of a bifunctional group or trifunctional group including the chalcogen element, as illustrated in FIG. 2. At this time, the organic molecular layer 20a provided on the top surface of the elementary metal 10 and the organic molecular layer 20b provided on the bottom surface of the elementary metal 10 may be formed of the same material or different materials. In other words, the elementary metal may be combined with the chalcogen element of the organic molecular layer.

The organic molecular layer according to an embodiment may maintain a 2D layer structure formed by the elementary metal having at least one layer. Here, even though the elementary metal is combined with the organic molecular layer, a metallic property of the elementary metal by X-ray photoelectron spectroscopy (XPS) analysis may be maintained. This may mean that the elementary metal formed of tungsten is not chemically combined with oxygen and a metallic property of tungsten is maintained even though the organic molecular layer is combined with oxygen.

In addition, as described above, the elementary metal composed of a predetermined number of layers may have the semiconductor properties in the stabilized elementary metal structure according to an embodiment of the inventive concepts, unlike a bulk metal. In more detail, a carrier concentration may not decrease in the elementary metal composed of the predetermined number of the layers as temperature rises. In other words, the carrier concentration may increase or be maintained as the temperature rises. Preferably, the carrier concentration may increase as the temperature rises. That is, the elementary metal composed of the predetermined number of the layers and interfaced by the organic molecular layer may have a band gap. If the number of layers of the elementary metal is greater than the predetermined number unlike the embodiment of the inventive concepts, the elementary metal may lose the semiconductor properties and may exhibit properties of a bulk metal. However, according to the embodiment of the inventive concepts, the number of the layers of the elementary metal may be limited, and thus the elementary metal may be provided as a creative material which has the semiconductor properties even though it is a metal.

The stabilized elementary metal structure according to the embodiment of the inventive concepts was described above with reference to FIGS. 1 and 2. A method of manufacturing a stabilized elementary metal structure according to an embodiment of the inventive concepts will be described hereinafter.

FIG. 3 is a flowchart illustrating a method of manufacturing a stabilized elementary metal structure according to an embodiment of the inventive concepts.

Referring to FIG. 3, a manufacturing method according to an embodiment of the inventive concepts may include at least one of first operation S110 of forming an organic molecular layer on a substrate by a molecular layer deposition (MLD) method, second operation S120 of forming an elementary metal having at least one layer on the organic molecular layer by an atomic layer deposition (ALD) method, or third operation S130 of forming an organic molecular layer on the elementary metal by a MLD method. In an embodiment, the manufacturing method may include the second and third operations S120 and S130, and the first operation S110 may be omitted in the manufacturing method. In another embodiment, the manufacturing method may include the first and second operations S110 and S120, and the third operation S130 may be omitted in the manufacturing method.

For reference, the ALD method may be a technique of depositing a monolayer using a self-control reaction at an atomic level and may deposit a monolayer using chemical adsorption and desorption processes on a surface of a substrate. In addition, the MLD method may mean a vapor deposition method capable of adjusting organic molecules at a molecular level through a self-control surface reaction. In other words, it may be understood that the ALD method of the atomic level is expanded to the MLD method of the molecular level. Thus, since the ALD method and the MLD method are similar to each other, apparatuses may be compatible or interchangeable with each other when the ALD method and the MLD method are used together. Hereinafter, each of the operations will be described in detail.

Operation S110

In the operation S110, the organic molecular layer may be formed on the substrate by the MLD method. A kind of the substrate may be various. For example, the substrate may be a silicon substrate, a glass substrate, or a polymer substrate.

The operation S110 may include a unit cycle which includes dosing an organic precursor and performing a purging process. One layer of the organic molecular layer may be formed by the unit cycle. In other words, the number of layers of the deposited organic molecular layer may be controlled as the unit cycle is repeated.

In the operation S110, a pressure may range from 0.001 Torr to 1 Torr, and a process temperature may range from 80 degrees Celsius to 200 degrees Celsius. In particular, a temperature of the organic precursor may range from 25 degrees Celsius to 100 degrees Celsius.

In the dosing of the organic precursor, the organic precursor may be selected depending on a kind of the organic molecular layer to be deposited. For example, the organic precursor may include at least one of, but not limited to, 4-mercaptophenol (4MP) or benzenedithiol (BDT). The organic precursor may be adsorbed on the substrate by the dosing of the organic precursor.

The purging process may be performed after the dosing of the organic precursor to remove the organic precursor which is not adsorbed on the substrate but remains.

Thus, the organic molecular layer having a desired thickness may be deposited on the substrate.

Operation S120

The operation S120 may be a process for forming the elementary metal having at least one layer on the organic molecular layer formed by the operation S110. In more detail, the operation S120 may mean a unit cycle which includes dosing a metal precursor, performing a purging process, dosing a reactant, and performing a purging process. One layer of the elementary metal may be formed by the unit cycle. In other words, the number of layers of the deposited elementary metal may be controlled as the unit cycle is repeated.

In the dosing of the metal precursor, the metal precursor may be selected depending on a kind of the elementary metal to be deposited. For example, when a tungsten elementary metal is deposited, a metal precursor gas may include tungsten hexafluoride ($WF_6$). For another example, when a molybdenum elementary metal is deposited, the metal precursor gas may include molybdenum hexafluoride ($MoF_6$).

When the purging process is performed, an inert gas may be used. For example, the inert gas may include argon (Ar) or nitrogen ($N_2$). A remaining metal precursor which is not adsorbed on a surface of the substrate may be removed by the purging process.

In the dosing of the reactant, the reactant may be formed of a material for reducing the metal precursor gas to a metal. For example, when the metal precursor is tungsten hexafluoride ($WF_6$) or molybdenum hexafluoride ($MoF_6$), the reactant (or a reaction gas) may include disilane ($Si_2H_6$).

The purging process may be further performed after the dosing of the reactant. Thus, an excess supply gas which is not adsorbed on the surface of the substrate may be removed, and the elementary metal may be formed. The aforementioned unit cycle including dosing the metal precursor, performing the purging process, dosing the reactant, and performing the purging process may be repeated to form a multi-layered elementary metal.

Pressurization Dosing of Operation S120

The dosing of the metal precursor may be performed in a pressurized atmosphere. In other words, the dosing of the metal precursor may be performed in a high-pressure atmosphere. Here, when a repetition number of the dosing of the metal precursor increases, the pressure may be substantially constant or may gradually increase. This may be abbreviated as a pressurization dosing operation. The pressurization dosing operation of the metal precursor is described above for the purpose of ease and convenience in description. However, the pressurization dosing operation may be applied to the dosing of the reactant.

In an embodiment, the pressurization dosing operation may be performed in a state in which the inside of a chamber provided with the substrate is sealed. For example, the metal precursor may be supplied into the chamber in a state in which an outlet valve of the chamber is closed, and thus the inside of the chamber may be induced to high pressure and the induced high pressure may be maintained. The high pressure may be maintained for a certain time, and thus the metal precursor gas may be adsorbed on a target surface in the high pressure atmosphere.

According to an embodiment, in the pressurization dosing operation, the pressure in the chamber may be maintained in a range of 0.3 Torr to 100 Torr. If the pressure in the chamber is lower than 0.3 Torr, an adsorption rate of the metal precursor may be remarkably reduced. If the pressure in the chamber is higher than 100 Torr, the surface of the substrate may be damaged. Thus, the pressure in the chamber may range from 0.3 Torr to 100 Torr in the pressurization dosing operation. As a result, the metal precursor may be adsorbed on the surface of the substrate.

In addition, sub-operations of the operation S120 may be performed at the same temperature, in particular, low temperature. The low temperature used herein may mean a temperature of 200 degrees Celsius or less, in particular, a temperature of 100 degrees Celsius to 200 degrees Celsius. Generally, an aggregation phenomenon may occur in the elementary metal by high reactivity of the metal. Accordingly, the temperature of the process may be maintained at the low temperature of 100 degrees Celsius to 200 degrees Celsius, and thus the aggregation phenomenon of the elementary metal may be prevented.

As a result, the elementary metal may be deposited on the organic molecular layer by the operation S120 and may be effectively deposited by the pressurization dosing operation.

Operation S130

In the operation S130, the organic molecular layer may be formed on the elementary metal having at least one layer, deposited by the operation S120. The operation S130 may substantially correspond to the operation S110, and thus detailed descriptions to the operation S130 are omitted.

According to an embodiment, a seed layer may be formed at an interface of the organic molecular layer and the elementary metal. For example, the seed layer may be formed by an ALD method. The seed layer may be formed of a material including a chalcogen element for combining with the elementary metal, for example, $Al_2O_3$ and/or $TiO_2$. The seed layer may provide a surface treatment effect for easily performing deposition between the organic molecular layer and the elementary metal.

According to the embodiments of the inventive concepts in FIG. 3, the elementary metal having at least one or more layers may be formed in the form of the 2D layer structure, and the organic molecular layer may be formed on at least one surface of the elementary metal to maintain the 2D layer structure of the elementary metal. Thus, stability of the elementary metal may be improved.

Experimental examples of the inventive concepts will be described hereinafter with reference to FIGS. 4 to 13.

First Experimental Example

FIG. 4A and FIG. 4B show a molecule structure and a TEM image of a stabilized elementary metal structure according to a first experimental example of the inventive concepts, FIG. 5 is a graph showing changes in conductivity over time of a typical elementary metal and the stabilized elementary metal structure according to the first experimental example of the inventive concepts, and FIG. 6 is a graph showing XPS analysis of the stabilized elementary metal structure according to the first experimental example of the inventive concepts.

W(BDT)2 was prepared as a first experimental example. For this end, BDT was deposited on a glass substrate by a MLD method. BDT was prepared as the organic precursor, and argon was prepared as a purging gas. The organic precursor was dosed at a pressure of 200 mTorr for 20 seconds, and a purging process was continuously performed for 60 seconds. A temperature of each process was 100 degrees Celsius. Thus, an organic molecular layer having a thickness of about 1 nm was deposited.

A tungsten elementary metal having at least one layer was deposited on the deposited BDT. For this end, $WF_6$ was used as the metal precursor, $Si_2H_6$ was used as the reactant, and a deposition temperature was about 100 degrees Celsius. Detailed process conditions of an ALD method were listed in the following tables 1 and 2.

$WF_6$, and $Si_2H_6$ are exposed in certain pressure during 30 s as shown in tables 1 and 2

TABLE 1

|      | WF$_6$   | P    | WF$_6$   | P    | WF$_6$   | P    | WF$_6$   | P    | WF$_6$   | P    |
|------|----------|------|----------|------|----------|------|----------|------|----------|------|
| Time | 30 s     | 30 s | 30 s     | 30 s | 30 s     | 30 s | 30 s     | 30 s | 30 s     | 30 s |
| Pressure | 1.0 Torr | | 1.5 Torr | | 2.0 Torr | | 2.5 Torr | | 3.0 Torr | |

TABLE 2

|      | Si$_2$H$_6$ | P    | Si$_2$H$_6$ | P    | Si$_2$H$_6$ | P    | Si$_2$H$_6$ | P    | Si$_2$H$_6$ | P    |
|------|-------------|------|-------------|------|-------------|------|-------------|------|-------------|------|
| Time | 30 s        | 30 s | 30 s        | 30 s | 30 s        | 30 s | 30 s        | 30 s | 30 s        | 30 s |
| Pressure | 1.0 Torr | | 1.5 Torr    | | 2.0 Torr    | | 2.5 Torr    | | 3.0 Torr    | |

BDT (about 1 nm) was deposited again on the deposited tungsten elementary metal by the method described above.

W(BDT)2 according to the first experimental example was prepared by the process conditions described above, as shown in FIG. 4A and FIG. 4B.

Referring to FIG. 5, changes in conductivity over time of a comparative example and the first experimental example are shown. The comparative example simply has only a tungsten elementary metal. In the first experimental example, the tungsten elementary metal is protected by the BDT organic molecular layers. For reference, the tungsten elementary metal was composed of 6 layers and had a thickness of about 2 nm.

Referring to the comparative example shown in FIG. 5, the conductivity over exposure time sharply decreases. On the contrary, referring to the first experimental example shown in FIG. 5, the conductivity over exposure time of the elementary metal structure according to the embodiment of the inventive concepts is hardly changed.

This may be because the organic molecular layer stably maintains the 2D layer structure of the elementary metal, as described above. In addition, this may be because the organic molecular layer prevents oxidation of the elementary metal.

Referring to FIG. 6, XPS results of the elementary metal structure according to the first experimental example of the inventive concepts are shown. For reference, the tungsten elementary metal was composed of 10 layers and had a thickness of about 3 nm. As shown in FIG. 6, tungsten of the first experimental example is not combined with sulfur but itself exists. In other words, even though the tungsten elementary metal is combined with sulfur, a metallic state of tungsten is maintained. That is, according to the manufacturing method of the inventive concepts, the metallic state of the elementary metal may be maintained even though the elementary metal is combined with an adjacent layer. In another aspect, it may be clearly checked that the metallic property of the elementary metal according to the XPS analysis is maintained even though the tungsten elementary metal is combined with the adjacent layer.

In addition, a surface roughness according to a thickness of the elementary metal structure according to the first experimental example of the inventive concepts was checked as shown in the following table 3.

TABLE 3

| Thickness | Surface roughness |
|-----------|-------------------|
| 3 Å       | 1.3 Å             |
| 10 Å      | 2.1 Å             |
| 12 Å      | 2.4 Å             |
| 20 Å      | 2.8 Å             |

Referring to the table 3, it may be recognized that the surface roughness decreases as the thickness of tungsten decreases. This may mean that tungsten is maintained in a stable state in which aggregation does not occur, even though tungsten forms the elementary metal. In other words, it may be recognized that the BDT layers formed on top and bottom surfaces of the tungsten elementary metal stably maintain the 2D layer structure of the tungsten elementary metal.

Second Experimental Example

FIG. 7A and FIG. 7B show a molecule structure and a TEM image of a stabilized elementary metal structure according to a second experimental example of the inventive concepts, and FIG. 8 is a graph showing electrical characteristics according to a thickness of the stabilized elementary metal structure according to the second experimental example of the inventive concepts. FIG. 9A and FIG. 9B show XPS analysis of the stabilized elementary metal structure according to the second experimental example of the inventive concepts, and FIG. 10 is a graph showing a change in carrier concentration according to temperature of the stabilized elementary metal structure according to the second experimental example of the inventive concepts.

W(4MP)2 was prepared as a second experimental example. For this end, 4MP was deposited on a glass substrate by a MLD method. 4MP was prepared as the organic precursor, and argon was prepared as a purging gas. The organic precursor was dosed at a pressure of 200 mTorr for 20 seconds, and a purging process was continuously performed for 60 seconds. A temperature of each process was 100 degrees Celsius. Thus, an organic molecular layer having a thickness of about 3 nm was deposited.

A tungsten elementary metal having at least one layer was deposited on the deposited 4MP. For this end, WF6 was used as the metal precursor, Si2H6 was used as the reactant, and a deposition temperature was about 100 degrees Celsius. Detailed process conditions of an ALD method were listed in the following tables 4 and 5. A unit cycle including WF$_6$, P (purge), Si$_2$H$_6$, and P was repeated a desired number of times while gradually increasing a pressure, thereby depositing the tungsten elementary metal.

WF$_6$, and Si$_2$H$_6$ are exposed in certain pressure during 30 s as shown in tables 4 and 5.

TABLE 4

| | WF$_6$ | P | WF$_6$ | P | WF$_6$ | P | WF$_6$ | P | WF$_6$ | P |
|---|---|---|---|---|---|---|---|---|---|---|
| Time | 30 s | 30 s | 30 s | 30 s | 30 s | 30 s | 30 s | 30 s | 30 s | 30 s |
| Pressure | 1.0 Torr | | 1.5 Torr | | 2.0 Torr | | 2.5 Torr | | 3.0 Torr | |

TABLE 5

| | Si$_2$H$_6$ | P | Si$_2$H$_6$ | P | Si$_2$H$_6$ | P | Si$_2$H$_6$ | P | Si$_2$H$_6$ | P |
|---|---|---|---|---|---|---|---|---|---|---|
| Time | 30 s | 30 s | 30 s | 30 s | 30 s | 30 s | 30 s | 30 s | 30 s | 30 s |
| Pressure | 1.0 Torr | | 1.5 Torr | | 2.0 Torr | | 2.5 Torr | | 3.0 Torr | |

4MP (about 3 nm) was deposited again on the deposited tungsten elementary metal by the method described above.

In addition, an Al$_2$O$_3$ seed layer was deposited between the tungsten elementary metal and the 4MP organic molecular layer by an ALD method. In detail, a unit process including dosing TMA (a metal precursor gas) for 2 seconds, purging for 20 seconds, dosing water for 2 seconds, and purging for 40 seconds was performed once, a deposition temperature was 100 degrees Celsius, and a pressure in dosing was 20 mTorr. Thus, the seed layers were formed on a top surface and a bottom surface of the elementary metal, respectively.

W(4MP)2 according to the second experimental example was manufactured by the process conditions described above, as shown in FIG. 7A and FIG. 7B.

Referring to FIG. 8, electrical characteristics according to a thickness of the stabilized elementary metal structure according to the second experimental example are shown. Quantitative results are shown in the following table 6.

TABLE 6

| W thickness (nm) | Resistivity (Ω · cm) | Carrier concentration (cm$^{-3}$) |
|---|---|---|
| 1 | 100 | 10$^{17}$ |
| 2 | 3 | 10$^{18}$ |
| 2.5 | 0.0014 | 10$^{21}$ |
| 3 | 1.1*10$^{-4}$ | 10$^{23}$ |
| 5 | 9.4*10$^{-5}$ | 10$^{23}$ |

FIG. 8 shows resistivity (a left Y axis) and a carrier concentration (a right Y axis) when the tungsten elementary metals are composed of from 3 layers to 15 layers. In detail, as the number of the layers of the elementary metal increases, the resistivity of the elementary metal structure according to the second experimental example decreases and the carrier concentration thereof increases. In other words, electrical characteristics of the tungsten elementary metal converge to electrical characteristics of bulk tungsten as the thickness of the tungsten elementary metal increases. Referring to the experimental values of FIG. 8, when the thickness of the tungsten elementary metal is 5 nm or less, the tungsten elementary metal has electrical characteristics (e.g., the resistivity and the carrier concentration) different from those of bulk tungsten. In particular, when the thickness of the tungsten elementary metal is 3 nm or less, the carrier concentration of the tungsten elementary metal is significantly lowered as compared with that of bulk tungsten and the resistivity of the tungsten elementary metal significantly increases as compared with that of bulk tungsten.

Referring to FIG. 9A and FIG. 9B, XPS results of the elementary metal structure according to the second experimental example are shown. For reference, the tungsten elementary metal was composed of 3 layers and had a thickness of about 1 nm. As shown in FIG. 9A and FIG. 9B, tungsten of the second experimental example itself exists. In other words, even though the tungsten elementary metal is combined with oxygen, a metallic state of tungsten is maintained. That is, according to the manufacturing method of the inventive concepts, the metallic state of the elementary metal may be maintained even though the elementary metal is combined with an adjacent layer. In another aspect, it may be clearly checked that the metallic property of the elementary metal according to the XPS analysis is maintained even though the tungsten elementary metal is combined with the adjacent layer.

Referring to FIG. 10, a carrier concentration according to temperature of the elementary metal structure according to the second experimental example is shown. In addition, results according to a change in the number of the layers of the tungsten elementary metal are shown.

As shown in FIG. 10, even though the temperature rises, the carrier concentration of the elementary metal structure is substantially maintained or increases. In particular, when the thickness of the tungsten elementary metal is 3.0 nm or 5.0 nm, the carrier concentration is substantially constant regardless of the temperature. However, when the thickness of the tungsten elementary metal is 2 nm, the carrier concentration is markedly reduced from 10$^{18}$ to 10$^{17}$ as the temperature is reduced from 300K to 240K. This may mean that the tungsten elementary metal is changed from a bulk metal into a semiconductor having a band gap as the thickness of the tungsten elementary metal decreases.

The elementary metal structure according to the second experimental example of the inventive concepts was described above with reference to FIGS. 7A to 10. Hereinafter, a third experimental example of the inventive concepts will be described with reference to FIGS. 11A to 13B.

Third Experimental Example

FIG. 11A and FIG. 11B show a molecule structure and a TEM image of a stabilized elementary metal structure according to a third experimental example of the inventive concepts, FIG. 12 is a graph showing electrical characteristics according to a thickness of the stabilized elementary metal structure according to the third experimental example of the inventive concepts, and FIGS. 13A and 13B shows XPS analysis of the stabilized elementary metal structure according to the third experimental example of the inventive concepts.

Mo(4MP)2 was prepared as a third experimental example. For this end, 4MP was deposited on a glass substrate by a MLD method. 4MP was prepared as the organic precursor, and argon was prepared as a purging gas. The organic precursor was dosed at a pressure of 200 mTorr for 20 seconds, and a purging process was continuously performed for 60 seconds. A temperature of each process was 100 degrees Celsius. Thus, an organic molecular layer having a thickness of about 3 nm was deposited.

A molybdenum elementary metal having at least one layer was deposited on the deposited 4MP. For this end, $MoF_6$ was used as the metal precursor, $Si_2H_6$ was used as the reactant, and a deposition temperature was about 100 degrees Celsius. Detailed process conditions of an ALD method were listed in the following tables 7 and 8. A unit cycle including $MoF_6$, P (purge), $Si_2H_6$, and P was repeated a desired number of times while gradually increasing a pressure, thereby depositing the tungsten elementary metal.

$MoF_6$, and $Si_2H_6$ are exposed in certain pressure during 30 s as shown in tables 7 and 8.

TABLE 7

|  | $MoF_6$ | P | $MoF_6$ | P | $MoF_6$ | P | $MoF_6$ | P | $MoF_6$ | P |
|---|---|---|---|---|---|---|---|---|---|---|
| Time | 30 s | 30 s | 30 s | 30 s | 30 s | 30 s | 30 s | 30 s | 30 s | 30 s |
| Pressure | 1.0 Torr |  | 1.5 Torr |  | 2.0 Torr |  | 2.5 Torr |  | 3.0 Torr |  |

TABLE 8

|  | $Si_2H_6$ | P | $Si_2H_6$ | P | $Si_2H_6$ | P | $Si_2H_6$ | P | $Si_2H_6$ | P |
|---|---|---|---|---|---|---|---|---|---|---|
| Time | 30 s | 30 s | 30 s | 30 s | 30 s | 30 s | 30 s | 30 s | 30 s | 30 s |
| Pressure | 1.0 Torr |  | 1.5 Torr |  | 2.0 Torr |  | 2.5 Torr |  | 3.0 Torr |  |

4MP (about 3 nm) was deposited again on the deposited molybdenum elementary metal by the method described above.

In addition, an $Al_2O_3$ seed layer was deposited between the molybdenum elementary metal and the 4MP organic molecular layer by an ALD method. In detail, a unit process including dosing TMA (a metal precursor gas) for 2 seconds, purging for 20 seconds, dosing water for 2 seconds, and purging for 40 seconds was performed once, a deposition temperature was 100 degrees Celsius, and a pressure in dosing was 20 mTorr. Thus, the seed layers were formed on a top surface and a bottom surface of the elementary metal, respectively.

Mo(4MP)2 according to the third experimental example was prepared by the process conditions described above, as shown in FIG. 11A and FIG. 11B.

Referring to FIG. 12, electrical characteristics according to a thickness of the stabilized elementary metal structure according to the third experimental example are shown. Quantitative results are shown in the following table 9.

TABLE 9

| Mo thickness (nm) | Resistivity ($\Omega \cdot cm$) | Carrier concentration ($cm^{-3}$) |
|---|---|---|
| 1 | $3.14*10^{-4}$ | $5.8*10^{22}$ |

TABLE 9-continued

| Mo thickness (nm) | Resistivity ($\Omega \cdot cm$) | Carrier concentration ($cm^{-3}$) |
|---|---|---|
| 2 | $1.22*10^{-4}$ | $9.8*10^{22}$ |
| 3 | $6.43*10^{-5}$ | $2.5*10^{23}$ |
| 4 | $5.72*10^{-5}$ | $4.4*10^{23}$ |
| 5 | $5.21*10^{-5}$ | $5.0*10^{23}$ |

FIG. 12 shows resistivity (a left Y axis) and a carrier concentration (a right Y axis) when the thickness of the molybdenum elementary metal ranges from 1 nm to 15 nm. In detail, as the number of the layers of the elementary metal increases, the resistivity of the elementary metal structure according to the third experimental example decreases and the carrier concentration thereof increases. In other words, electrical characteristics of the molybdenum elementary metal converge to electrical characteristics of bulk molybdenum as the thickness of the molybdenum elementary metal increases. Referring to the experimental values of FIG. 12, when the thickness of the molybdenum elementary metal is 15 nm or less (in particular, 5 nm or less), the molybdenum elementary metal has electrical characteristics (e.g., the resistivity and the carrier concentration) different from those of bulk molybdenum. In particular, when the thickness of the molybdenum elementary metal is 3 nm or less, the carrier concentration of the molybdenum elementary metal is significantly lowered as compared with that of bulk molybdenum and the resistivity of the molybdenum elementary metal significantly increases as compared with that of bulk molybdenum.

Referring to FIG. 13A and FIG. 13B, XPS results of the elementary metal structure according to the third experimental example are shown. For reference, the molybdenum elementary metal was composed of 3 layers and had a thickness of about 1 nm. As shown in FIG. 13A and FIG. 13B, the molybdenum elementary metal according to the third experimental example exists as molybdenum metal itself. In other words, even though the molybdenum elementary metal is combined with oxygen, a metallic state of molybdenum is maintained. That is, according to the manufacturing method of the inventive concepts, the metallic state of the elementary metal may be maintained even though the elementary metal is combined with an adjacent layer. In another aspect, it may be clearly checked that the metallic property of the elementary metal according to the XPS analysis is maintained even though the tungsten elementary metal is combined with the adjacent layer.

According to the stabilized elementary metal structure and the method of manufacturing the same in the aforementioned embodiments of the inventive concepts, the elementary metal may be interfaced by the organic molecular layer and may have the predetermined number of the layers. Thus, the elementary metal may have properties (e.g., the semiconductor properties) different from those of a bulk metal. Nevertheless, the elementary metal according to the embodiments of the inventive concepts may maintain the metallic property as the XPS analysis. In addition, the organic molecular layer may maintain the 2D layer structure of the elementary metal, and thus the stability of the elementary metal having at least one layer may be improved. As a result, the stabilized elementary metal structure and the method of manufacturing the same according to the inventive concepts may provide a material having new properties different from those of a typical bulk metal and may be used in devices having a semiconductor function and new applications.

The stabilized elementary metal structure according to the embodiments of the inventive concepts may include the elementary metal having at least one layer and having the two-dimensional layer structure, and the organic molecular layer provided on at least one of the top surface and the bottom surface of the elementary metal. The organic molecular layer may maintain the structural shape of the two-dimensional layer structure.

In addition, according to the embodiments of the inventive concepts, the number of the layers of the elementary metal may be limited to the predetermined number, and thus the elementary metal may have the semiconductor properties unlike a bulk metal. Moreover, the organic molecular layer may maintain the shape of the elementary metal, and thus the stability of the elementary metal structure may be improved. As a result, the stabilized elementary metal structure according to the embodiments of the inventive concepts may function as a creative material replacing a typical semiconductor. Furthermore, the elementary metal according to the embodiments of the inventive concepts may be applied to flexible devices due to its thin thickness.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A two-dimensional elementary metal structure comprising:
    an elementary metal layer formed using ALD (Atomic Layer Deposition) having 3 to 15 atomic layers and having a two-dimensional structure, wherein the elementary metal layer is formed of a metal selected from Group 4 metals, Group 5 metals, and Group 6 metals; and
    organic molecular layers provided on a top surface and a bottom surface of the elementary metal layer,
    wherein each of the organic molecular layers include a bifunctional group or trifunctional group including a chalcogen element and are formed using MLD (Molecular Layer Deposition),
    wherein the elementary metal layer is chemically bonded to the chalcogen element of the organic molecular layers,
    wherein the elementary metal layer has a metallic property according to X-ray photoelectron spectroscopy (XPS) analysis even though the elementary metal layer is chemically bonded to the chalcogen element of the organic molecular layers, and
    wherein the elementary metal layer has semiconductor properties.

2. The two-dimensional elementary metal structure of claim 1, wherein a carrier concentration in the elementary metal layer does not decrease as temperature rises.

3. The two-dimensional elementary metal structure of claim 1, wherein the elementary metal layer has a band gap.

4. The two-dimensional elementary metal structure of claim 1, wherein the elementary metal layer is formed of a metal selected from W and Mo.

5. A two-dimensional elementary metal structure comprising:
    an elementary metal layer formed using ALD (Atomic Layer Deposition) having 3 to 15 atomic layers and having a two-dimensional structure, wherein the elementary metal layer is formed of a metal selected from Group 4 metals, Group 5 metals, and Group 6 metals; and
    organic molecular layers provided on a top surface and a bottom surface of the elementary metal layer,
    wherein each of the organic molecular layers includes a bifunctional group or trifunctional group including a chalcogen element and formed using MLD (Molecular Layer Deposition),
    wherein the elementary metal layer is chemically bonded to the chalcogen element of the organic molecular layers,
    wherein the elementary metal layer has a metallic property according to X-ray photoelectron spectroscopy (XPS) analysis even though the elementary metal layer is chemically bonded to the chalcogen element of the organic molecular layer, and
    wherein the elementary metal layer provides a band gap.

6. The two-dimensional elementary metal structure of claim 5, wherein the elementary metal layer has semiconductor properties, unlike a bulk metal formed of a metal of the elementary metal layer.

7. The two-dimensional elementary metal structure of claim 5, wherein the elementary metal layer is formed of a metal selected from W and Mo.

8. The two-dimensional elementary metal structure comprising:
    an elementary metal layer formed using ALD (Atomic Layer Deposition) having 3 to 15 atomic layers and having a two-dimensional structure, wherein the elementary metal layer is formed of a metal selected from Group 4 metals, Group 5 metals and Group 6 metals; and
    adjacent layers having organic molecular layers provided on a top surface and a bottom surface of the elementary metal layer using MLD (Molecular Layer Deposition),
    wherein each of the organic molecular layers includes a bifunctional group or trifunctional group including chalcogen element,
    wherein each of the adjacent layers further comprises a seed layer formed at an interface of each of the organic molecular layers and the elementary metal layer, the seed layer is formed of a material including a chalcogen element using ALD, and the chalcogen element of the seed layer is chemically bonded to the elementary metal layer,
    wherein the elementary metal layer has a metallic property according to X-ray photoelectron spectroscopy (XPS) analysis even though the elementary metal layer is chemically bonded to the chalcogen element of the seed layer, and wherein the elementary metal layer has semiconductor properties.

9. The two-dimensional elementary metal structure of claim 8, wherein the seed layer is $Al_2O_3$ or $TiO_2$.

10. The two-dimensional elementary metal structure of claim 8, wherein the elementary metal layer is formed of a metal selected from W and Mo.

* * * * *